US007246336B2

(12) United States Patent
Zolotykh et al.

(10) Patent No.: US 7,246,336 B2
(45) Date of Patent: Jul. 17, 2007

(54) RAMPTIME PROPAGATION ON DESIGNS WITH CYCLES

(75) Inventors: Andrej A. Zolotykh, Fryazino (RU); Elyar E. Gasanov, Moscow (RU); Alexei V. Galatenko, Moscow (RU); Ilya V. Lyalin, Moscow (RU)

(73) Assignee: LSI Corporation, Milpitas, CA (US)

( * ) Notice: Subject to any disclaimer, the term of this patent is extended or adjusted under 35 U.S.C. 154(b) by 271 days.

(21) Appl. No.: 11/004,309

(22) Filed: Dec. 3, 2004

(65) Prior Publication Data

US 2006/0123369 A1 Jun. 8, 2006

(51) Int. Cl.
G06F 17/50 (2006.01)
(52) U.S. Cl. .......................................... 716/10; 716/11
(58) Field of Classification Search ............... 716/8–12
See application file for complete search history.

(56) References Cited

U.S. PATENT DOCUMENTS

| | | | | |
|---|---|---|---|---|
| 5,532,582 A | 7/1996 | Egami | ................. | 324/130 |
| 5,581,373 A | 12/1996 | Yoshida | ................. | 358/476 |
| 5,625,803 A | 4/1997 | McNelly et al. | ............ | 395/500 |
| 5,692,160 A | 11/1997 | Sarin | ..................... | 395/500 |
| 5,768,145 A | 6/1998 | Roethig | ................. | 364/488 |
| 5,835,380 A | 11/1998 | Roethig | ................. | 364/488 |
| 5,903,468 A | 5/1999 | Misheloff et al. | ............ | 364/488 |
| 6,173,435 B1 | 1/2001 | Dupenloup | ................. | 716/18 |
| 6,184,711 B1 | 2/2001 | Graef et al. | ................. | 326/41 |
| 6,205,572 B1 | 3/2001 | Dupenloup | ................. | 716/5 |
| 6,263,483 B1 | 7/2001 | Dupenloup | ................. | 716/18 |
| 6,289,491 B1 | 9/2001 | Dupenloup | ................. | 716/5 |
| 6,289,498 B1 | 9/2001 | Dupenloup | ................. | 716/18 |
| 6,292,766 B1 | 9/2001 | Mattos et al. | ................. | 703/14 |
| 6,292,931 B1 | 9/2001 | Dupenloup et al. | ............ | 716/18 |
| 6,295,636 B1 | 9/2001 | Dupenloup et al. | ............ | 716/18 |
| 6,378,123 B1 | 4/2002 | Dupenloup et al. | ............ | 716/18 |
| 6,421,818 B1 | 7/2002 | Dupenloup et al. | ............ | 716/18 |
| 6,457,160 B1 | 9/2002 | Graef et al. | ................. | 716/6 |
| 6,484,297 B1 | 11/2002 | Dixit et al. | ................. | 716/6 |
| 6,507,939 B1 * | 1/2003 | Andreev et al. | ............ | 716/10 |
| 6,543,032 B1 | 4/2003 | Zolotykh et al. | ............ | 716/2 |
| 6,546,541 B1 | 4/2003 | Petranovic et al. | ............ | 716/18 |
| 6,550,044 B1 | 4/2003 | Pavisic et al. | ................. | 716/6 |
| 6,564,361 B1 | 5/2003 | Zolotykh et al. | ............ | 716/8 |
| 6,634,014 B1 * | 10/2003 | Lindberg et al. | ............ | 716/6 |
| 6,640,330 B1 | 10/2003 | Joshi | ..................... | 716/9 |

(Continued)

OTHER PUBLICATIONS

Hao Zheng et al. "Modular Verification of Timed Circuits Using Automatic Abstraction," *IEEE Transactions on Computer-Aided Design of Integrated Circuits and Systems*, vol. 22, No. 9, Sep. 2003, pp. 1138-1153.

*Primary Examiner*—Jack Chiang
*Assistant Examiner*—Binh Tat
(74) *Attorney, Agent, or Firm*—Westman, Champlin & Kelly (57) ABSTRACT

A method for calculating ramptime propagation for integrated circuit layout patterns having pins interconnected in an oriented graph in one or more closed loops is described. Ramptime values are calculated for a first set of the pins, which are not connected to a closed loop while leaving a second set of the pins with unknown ramptime values. One or more closed loops are identified by backtracking from the pins in the second set with unknown ramptime values. A ramptime value for each pin in the one or more closed loops is calculated iteratively.

15 Claims, 10 Drawing Sheets

U.S. PATENT DOCUMENTS

| | | | |
|---|---|---|---|
| 6,701,493 B2 | 3/2004 | Gasanov et al. | 716/4 |
| 6,820,048 B1 * | 11/2004 | Bhutani et al. | 703/15 |
| 6,941,533 B2 * | 9/2005 | Andreev et al. | 716/6 |
| 6,948,142 B2 * | 9/2005 | Tetelbaum et al. | 716/6 |
| 7,096,442 B2 * | 8/2006 | Lu et al. | 716/6 |
| 2003/0188274 A1 | 10/2003 | Gasanov et al. | 716/4 |
| 2004/0006584 A1 | 1/2004 | Vandeweerd | 709/107 |
| 2004/0098676 A1 | 5/2004 | Gasanov et al. | 716/2 |
| 2004/0221247 A1 | 11/2004 | Andreev et al. | 716/1 |

* cited by examiner

RAMPTIME PROPAGATION ON DESIGNS WITH CYCLES

FIELD OF THE INVENTION

The present invention relates to processes and systems for designing integrated circuits (ICs), sometimes referred to as "chips". More particularly, the present invention relates to a system and method for estimating ramptime propagation of signals within integrated circuit designs.

BACKGROUND OF THE INVENTION

Semiconductor integrated circuits are traditionally designed and fabricated by first preparing a schematic diagram or hardware description language (HDL) specification of a logical circuit in which functional elements are interconnected to perform a particular logic function. With standard cell technology, the schematic diagram of HDL specification is synthesized into standard cells of a specific cell library.

Each cell corresponds to a logical function unit or block, which is implemented by one or more transistors that are optimized for the cell. The logic designer selects particular cells according to a number of loads attached to the cell and to an estimated interconnection required for routing. The cells in the cell library are defined by cell library definitions. Each cell library definition includes cell layout definitions and cell characteristics. The cell layout definition includes a layout pattern of the transistors in the cell, geometry data for the cell's transistors and cell routing data. The cell characteristics include a cell propagation delay, a model of the cell's function, input capacitance, output capacitance and output ramptime as a function of load. The propagation delay is a function of the internal delay and the output loading (or "fan-out") of the cell.

A series of computer aided design tools generate a netlist from the schematic diagram or HDL specification of the selected cells and the interconnections between the cells. The netlist is used by a floor planner or placement tool to place the selected cells at particular locations in an integrated circuit layout pattern. The interconnections between the cells are then routed along predetermined routing layers. The design tools then determine the output loading of each cell as a function of the number of loads attached to each cell, the placement of each cell, and the routed interconnections.

A timing analysis tool is then used to identify timing violations within the circuit layout. The time it takes for a signal to travel along a particular path or "net" from one sequential element to another depends on the number of cells in the path, the internal cell delay, the number of loads attached to the cells in the path, the length of the routed interconnections in the path, and the drive strengths of the transistors in the path.

A timing violation may be caused by a number of factors. For example, a particular cell may not have a large enough drive strength to drive the number of loads that are attached to that cell. Also, exceptionally long routing paths may cause timing violations. Timing violations can be eliminated by making adjustments at each stage in the layout process. For example, the logic diagram or HDL specification can be changed to restructure or resynthesize certain sections of logic to improve timing through that section. Additionally, other changes and adjustments may be made in the layout to improve timing considerations and/or to meet design specifications.

Once the timing violations and timing considerations have been corrected, the timing analysis tool is again utilized to identify any further timing violations within the circuit layout. The processes of timing analysis and layout adjustment may be repeated iteratively until all timing violations have been eliminated. Once the layout timing has been resolved, the netlist, the cell layout definitions, the placement data, and the routing data together form an integrated circuit layout definition, which can be utilized to fabricate an integrated circuit.

The complexity of state of the art integrated circuits may cause such iterative procedures as described above to be repeated many times in order to achieve an IC design that meets the design criteria. One technique for achieving timing recomputation is described in U.S. Pat. No. 6,553,551 and is incorporated herein by reference in its entirety.

One issue that arises in timing recomputation and resynthesis involves interconnections between pins that form a closed loop or "cycle" within a layout pattern. Computing ramptime propagation within a layout pattern that includes a cycle requires determining ramptime calculations for each pin in the cycle, which is partially determined by timing from every other pin in the cycle. If there are no cycles in the IC design, ramptime propagation calculations can be performed without any problem on a level-by-level basis. However, to utilize a conventional iterative procedure for resolving ramptime propagation issues in layout patterns with cycles, multiple calculations and iterations are required for each of the many pins of the design.

There is a need in the art for a process and method for estimating ramptime propagation in layout designs with cycles. Embodiments of the present invention provide solutions to these and other problems, and offer advantages over the prior art.

SUMMARY OF THE INVENTION

A method for calculating ramptime propagation for integrated circuit layout patterns having pins interconnected in an oriented graph in one or more closed loops is described. Ramptime values are calculated for a first set of the pins, which are not connected to a closed loop while leaving a second set of the pins with unknown ramptime values. One or more closed loops are identified by backtracking from the pins in the second set with unknown ramptime values. A ramptime value for each pin in the one or more closed loops is calculated iteratively.

In one embodiment, a ramptime evaluation tool is adapted to calculate ramptime values for pins in an oriented graph based on an integrated circuit layout design. The ramptime evaluation tool is adapted to localize cycled parts of the design and to calculate iteratively only those ramptime values associated with pins in the cycled parts of the design.

In another embodiment, a method for calculating ramptime propagation on an integrated circuit layout is described. An oriented graph of pins in the design is constructed. Ramptime values are calculated for a first set of pins in the layout using a pin level assignment algorithm. Some of the pins of the first set of pins in the layout have predefined ramptimes. A cycled portion of the layout is localized. The cycled portion corresponds to a second set of pins of the layout that are interconnected to form a closed loop. Ramptime values for each pin in the second set are calculated iteratively.

DETAILED DESCRIPTION OF ILLUSTRATIVE EMBODIMENTS

The following disclosure is directed to an algorithm for calculating ramptime propagation on circuit layout designs with cycles, which localizes ramptime calculations for cycled parts of the layout design and uses an iterative procedure to calculate the ramptime propagation only for the cycled parts, for example. By limiting the iterative calculation procedure to small subparts of the larger design layout, a ramptime propagation calculation for the entire circuit layout is more efficient.

In general, each technology includes a specification that sets a maximum allowable ramptime that can occur at an input pin without causing a ramptime violation. Ramptime violations are reduced by generating a capacitance constraint for each net driver type in the technology library and by providing the capacitance constraints to the re-synthesis algorithm. The capacitance constraints estimate for each net in the netlist a total interconnect capacitance, including wire capacitance and pin capacitance that would result in the maximum allowable ramptime at the input pins coupled to that net. The capacitance constraints are used by the re-synthesis algorithm to ensure that each net has a capacitance that is smaller than the capacitance constraint of the net driver. With these constraints, it is guaranteed that the degraded ramptimes at each input pin are smaller than the maximum allowable ramptime value.

An embodiment of the present invention provides a method and apparatus for calculating ramptime propagation, which can be used, for example, to analyze timing after design optimization, such as that described in U.S. Pat. Nos. 6,546,361 and 6,470,487, which are incorporated herein by reference in their entirety. Additionally, the method and apparatus can be implemented as part of a design timing computation, such as that described in U.S. Pat. No. 6,553,551 which is incorporated herein by reference in its entirety.

The method and apparatus can be implemented as a stand-alone testing system for use with a computer or other processing system, or can be implemented as part of a larger internal re-synthesis tool. Moreover, the method and apparatus can be adapted to utilize standard delay libraries for high precision timing computation.

During cell delay calculation, an embodiment of the present invention determines all cell edge delays. An edge delay refers to the time necessary for a transition or "edge" of a signal to propagate from an input pin of a cell to the corresponding output pin of the cell. The delay of a cell edge is a sum of two components: an intrinsic delay of the cell and a transition delay of the cell. Each of these two components depends on cell type, on the capacitance of the net connected to the output pin, and on the ramptime of the input pin.

Generally, the capacitances of nets are local characteristics. To calculate a net capacitance of a given net, the system receives a list of pins of cells connected to a given net, as well as the topology of the corresponding wire. The net capacitance for each net in a layout can be calculated independently of each other.

By contrast, the calculation of a ramptime on pins is more complicated. The ramptime on a given output pin is equal to the maximum of the transition delay values for all input signals ending on the output pin. Thus, the ramptime on an output pin depends on the ramptimes on input pins of the cell that are connected by edges with the output pin.

By contrast, the ramptime on an input pin connected to a net is equal to the sum of the ramptime on the net driver, and of the locally calculated ramptime degradation. Additionally, a default ramptime value can be assigned to all unconnected input pins and to input pins connected to the power or to the ground of the design. It is assumed that ramptimes are provided for all inputs of the design.

A. Oriented Graph

Figure 1:
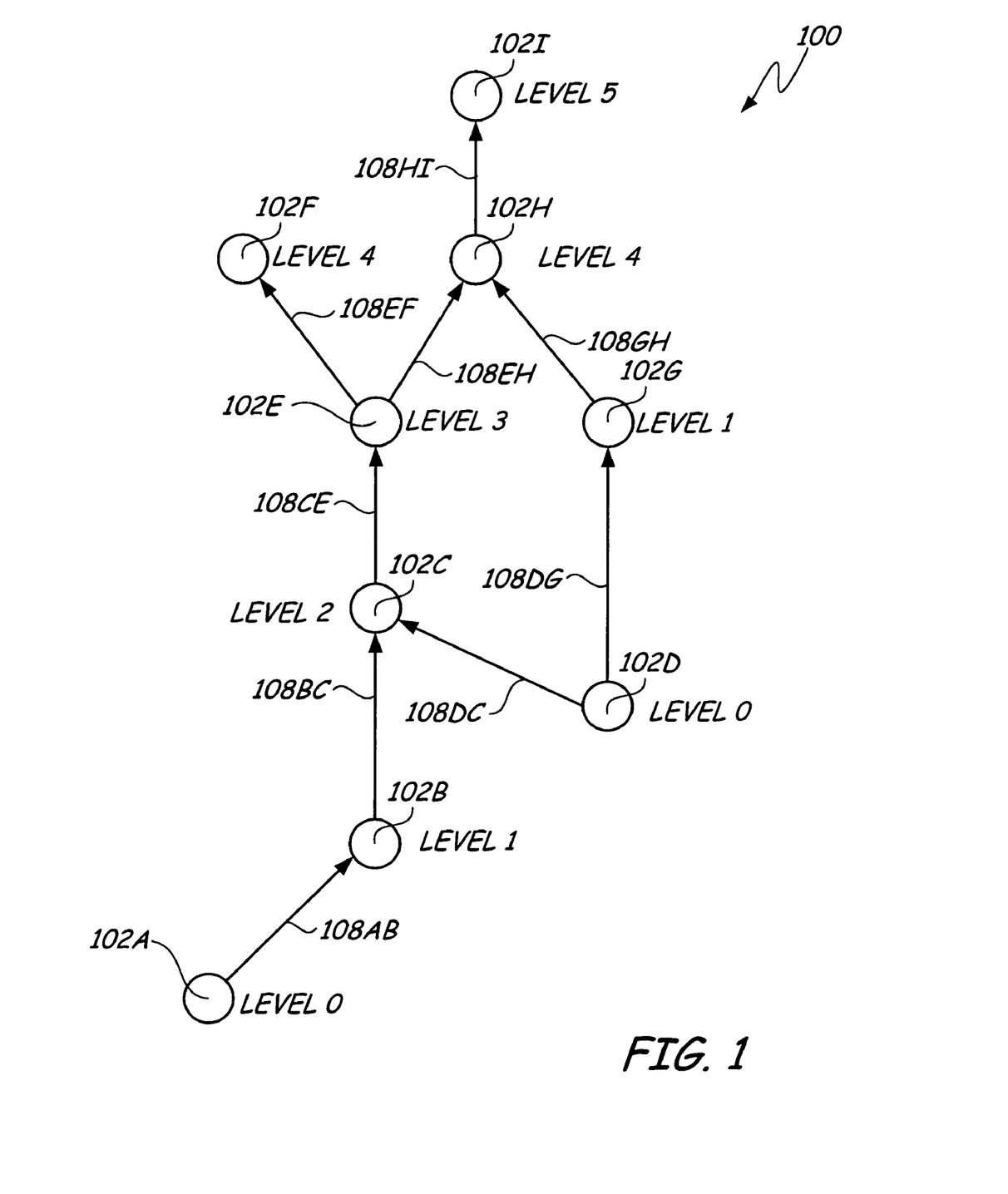
FIG. 1 is a simplified node diagram of a process for level assignment according to an embodiment of the present invention.

In general, FIG. 1 represents an oriented graph 100 according to an embodiment of the present invention. All cell pins 102 of the graph are considered vertices of the graph 100. Cell pins 102 connected by oriented edges 108, explained in more detail below. Within the figure, each cell pin 102 is differentiated by a letter (A–I), and the corresponding oriented edge 108 is indicated by the cell pin letters with the letters ordered according to the edge orientation. For example, an oriented edge 108 connecting pin 102A to pin 102B is identified as edge 108AB.

The term "oriented edge" refers to a direction of signal flow between cell pins, such as from an input pin of a cell to an output pin of the same cell, or from an output pin of one cell to an input pin of another cell. A pair of cell pins 102 (A,B) is connected by an oriented edge 108 if one of the following conditions is valid:

1. Cell pin "A" is an input pin of a cell, cell pin "B" is an output pin of the same cell, and there is a cell edge connecting pins A and B (i.e. the logic state on output pin B is determined at least in part by the logic state or edge transition on input pin A, such that the ramptime on pin B is a function of the ramptime on pin A); and
2. Cell pin A is an output pin of a cell, cell pin B is an input pin of a different cell, and pins A and B are connected by a wire.

In other words, a cell pin pair (A,B) has an oriented edge 108 if and only if the ramptime for the pin A must be known for the pin B ramptime calculation.

In the example shown in FIG. 1, a pair of pins (for example, 102A and 102B) has an oriented edge 108AB if one of the following conditions is valid:

1. Cell pin 102A is an input pin of a cell, cell pin 102B is an output pin of the same cell, and there is a cell edge connecting pins 102A and 102B; or
2. Cell pin 102A is an output pin of a cell, cell pin 102B is an input pin of a different cell, and cell pins 102A and 102B are connected by a wire 108AB.

Ramptimes of cell pins 102 within the graph 100 are assumed to be given or provided if the pin 102 has no edge 108 ending on it.

In the graph 100, pins 102A and 102D are at Level 0 and have no edges ending on them; therefore, the ramptimes for the input pins 102A and 102D are assumed to be given or known. These pins are level zero cell pins and can be considered as inputs to the oriented graph under consideration for ramptime calculation.

Pins 102B and 102G have at least one edge ending on them and are at Level one, since they are driven by at most one level of oriented edges, as measured from the inputs (pins 102A and 102D) of the oriented graph. A level two pin (such as pin 102C) is driven by one or more level 1 pins (such as pin 102B), but no higher level cell pins 102. A level two pin is therefore driven by two levels of oriented edges (such as 108AB and 108BC), as measured from the inputs to the oriented graph.

A level three pin (such as 102E) is coupled to one or more level two pins (such as pin 102C). A level four pin (such as cell pins 102F and 102H) are driven by one or more level three pins (in this case, pin 102E). Finally, a level five pin (such as cell pin 102I) is driven by one or more level 4 pins (such as cell pin 102H). Any number of cell pins 102 or levels are allowed. It is important to note that a pin 102 is assigned to a next level higher than its highest input from an oriented edge 108. For example, though pin 102H has inputs from level three pin 102E and a level 1 pin 102G over edges 108EH and 102GH, respectively, pin 102H is assigned to level four (one level higher than its highest level input 102E). In other words, pin 102H must be a level four pin because it accepts an input signal from a level three pin 102E.

In this particular example, the constructed oriented graph 100 does not contain any cycles, or closed loops. A cycle is a closed loop wherein the ramptime of each pin 102 of the cycle depends in part on the ramptime of every other pin 102 in the cycle. Consequently, the ramptime calculations can be made using a relatively simple the "level assignment algorithm" without concern for excessive iterations. It is assumed by the level assignment algorithm that some pins in the graph (level zero pins, such as cell pins 102A and 102D) have ramptime values that are known (given or assigned). For the designs without cycles, these are the pins without oriented edges ending on those pins. The ramptime values on these pins are either specified by users, or are the default ramptime values, for example. All such pins are set to level zero.

B. Level Assignment Algorithm

Figure 2:
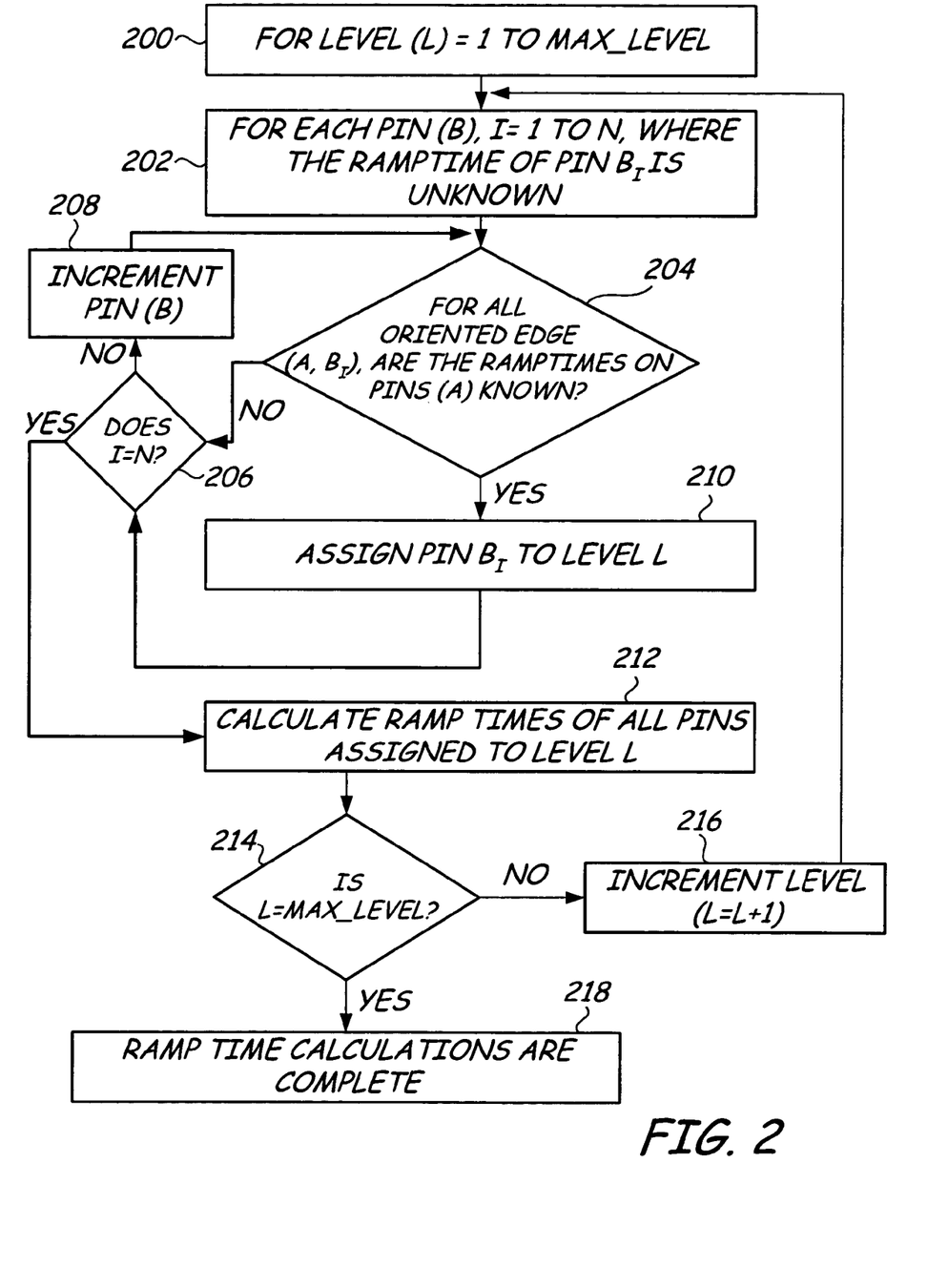
FIG. 2 is a simplified flow diagram for localized calculation of ramptime propagation in designs with cycles according to an embodiment of the present invention.

FIG. 2 is a flow chart, which illustrates an example of a level assignment algorithm that can be used to calculate the ramptimes of cell pins for the oriented graph shown in FIG. 1.

The general process for calculating ramptimes is provided in pseudo-code for a given level L, where L is within a range of 1 to a maximum level (step 200), the procedure is repeated until all levels are calculated. For each pin ($B_I$), from I=1 to N pins, where the ramptime of pin $B_I$ is unknown (step 202), the algorithm checks to see if for all oriented edges (A, $B_I$), the ramptimes on pins A are known (step 204). If not, the algorithm checks to see if $B_I$ is the last possible pin (is I=N pins) (step 206). If not, the algorithm increments the pin to the next pin in the list (I=I+1) (step 208), and repeats step 104. If $B_I$ is the last pin (I=N pins) (step 206), then the algorithm calculates ramptimes of all pins assigned to the level (L) (step 212). If the ramptime on pin A is known for the oriented edge (A,$B_I$) then the algorithm assigns pin $B_I$ to level L (step 210), the algorithm then checks to see if $B_I$ is the last pin (I=N pins) (step 206). If not, the algorithm increments the pin (step 208) and repeats the test for the ramptime on pin A for the oriented edge (step 204).

Again, if $B_I$ is the last pin (step 206), the algorithm calculates the ramptimes of all pins assigned to the level (L) (step 212). The algorithm then checks to see if L is the max level (step 214). If it is not, the algorithm increments the level (step 216) and repeats step 202 and sequence. If the level is the max level (step 214), then all ramptime calculations are complete (step 218).

C. Cycled Parts of a Design

In the case of a constructed oriented graph where the graph contains at least one cycle, the algorithm of FIG. 2 and the associated oriented graph of FIG. 1 are inapplicable because the ramptime on any pin 102 in the cycle depends on all other ramptimes of the cycle. Conventionally, an iterative procedure is used for ramptime calculations involving cycles. For example, at the beginning of the calculation, the ramptimes of all pins in the cycle are set to some default ramptime value. Then, the iterative ramptime calculation is started. The ramptimes on pins are calculated based on the current values of the ramptimes. Then, each of the pins is updated by assigning the newly calculated ramptime value. The ramptimes are then recalculated iteratively until the ramptime value for each input pin in the cycle changes by less than a predetermined amount (e.g. become almost stable). In other words, the iteratively calculated ramptime reaches a value that is very close to the corresponding value calculated during the previous iterative procedure.

Unfortunately, the iterative approach requires more and more iterations to achieve greater levels of accuracy. Moreover, the procedures calculating the transition delays and the ramptime degradations are usually very slow (if accuracy is required). Calculating ramptimes iteratively, it is necessary to call the ramptime calculation algorithm many times for each pin.

One embodiment of the present invention makes use of the observation that the cycled portions of oriented graphs are usually very small. Consequently, the ramptime calculation algorithm of this embodiment performs iterative calculations only on the small cycled portions, and calculates the ramptimes of other non-cycled pins using the level assignment algorithm described above. In this way, the ramptime calculation algorithm is able to avoid multiple ramptime calculations on large numbers of pins, so the algorithm introduces significant savings in both time and processing overhead. After the cycled part localization is made, the iterative ramptime calculation can be applied only to the cycled part, and then the ramptime calculation can be continued using the level assignment procedure, thereby simplifying and accelerating overall the ramptime calculation process.

In general, a graph is a cycled graph if for each vertice A,B of the graph, there is a path connecting the vertices. In other words, the graph is a cycled graph if there is a sequence of the oriented graph edges that forms a closed loop or circle. The simplest example of the cycled graph is a cycle or circle such as that shown in FIG. 3.

Figure 3:
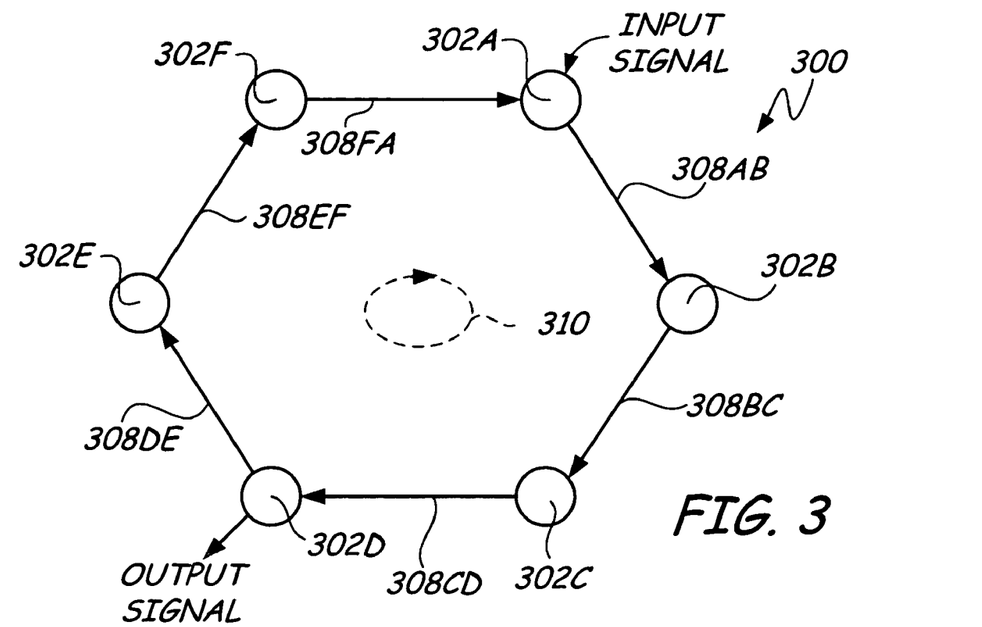
FIG. 3 is a simplified diagram of a cycled graph according to an embodiment of the present invention.

FIG. 3 illustrates a simplest form of a cycled graph 300 according to an embodiment of the present invention. The cycled graph 300 includes a plurality of pins 302A–302F wherein each pin of the graph 300 is coupled to another pin by an oriented edge 308AB–FA in a closed loop (indicated by phantom loop 310).

Figure 4:
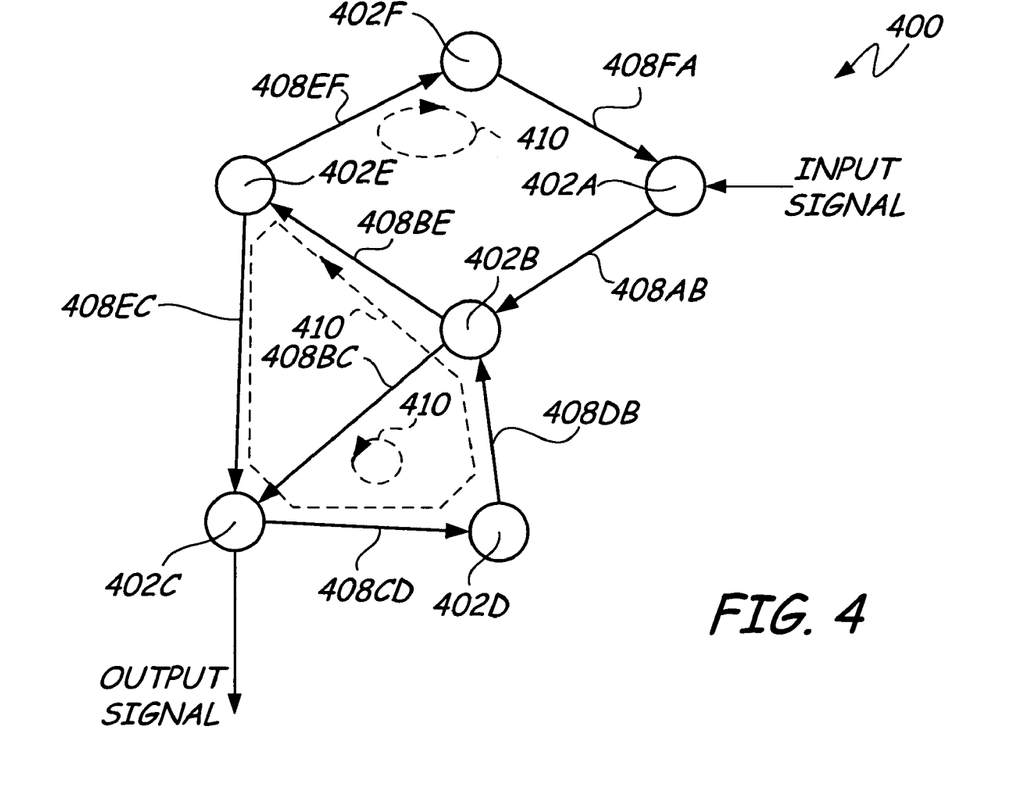
FIGS. 4 and 5 are diagrams of cycled graphs according to other embodiments of the present invention.

FIG. 4 illustrates a more complicated cycled graph 400 according to an embodiment of the present invention. Graph 400 includes pins 402A–402F and oriented edges 408AB–408FA. In this instance, pins 402B and 402E are coupled to more than one other pin 402 to form more than one cycle or loop 410.

Figure 5:
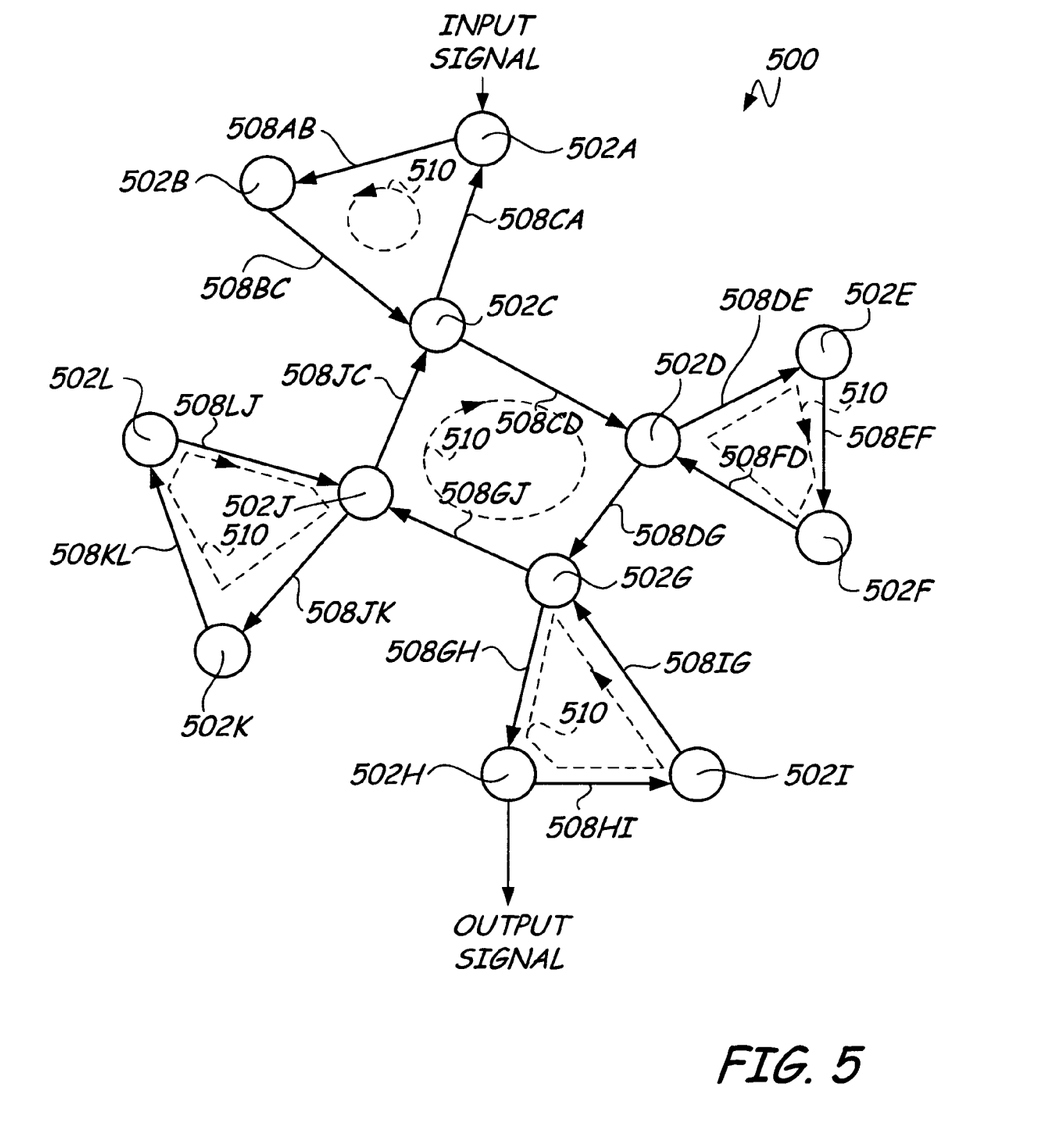

FIG. 5 illustrates a further complicated cycled graph 500 according to an embodiment of the present invention. Graph 500 includes pins 502A–502L with a plurality of oriented edges 508 extending between the pins. In this instance, pins 502C, 502D, 502G and 502J are coupled to more than one other pin 502 to form more than one cycle or loop 510.

Cycled subgraphs, such as those shown in FIGS. 4 and 5 have a property to be maximal. More precisely, if two cycled subgraphs of an oriented graph have a common vertex, then the union of these two subgraphs is a cycled graph. Thus, the ramptime on a pin in one cycled subgraph can depend on the ramptime of a pin in the other cycled subgraph. The ramptime calculation algorithm of one embodiment of the present invention locates maximal cycled subgraphs.

D. Cycle Localization Algorithm

In general, the level assignment algorithm of FIG. 2 can be applied to any design. If the design does not have a cycle, all pin ramptimes are calculated after the level assignment algorithm finishes. Otherwise, not all pin ramptimes are calculated.

If the design has one or more cycles, we can denote by M the set of all pins (A) such that the ramptime on the pin is not calculated yet. Note that for each pin $B \in M$ (B is contained in set M), there is an oriented edge (A,B) of the graph such that $A \in M$ (A is contained in set M).

With set M defined, we can start to construct a cycled subgraph to continue the ramptime calculation. As mentioned above, the algorithm looks for the maximal cycled subgraph because the ramptime on each pin of the maximal cycled subgraph depends on all other ramptimes of the cycled subgraph.

Figure 6:
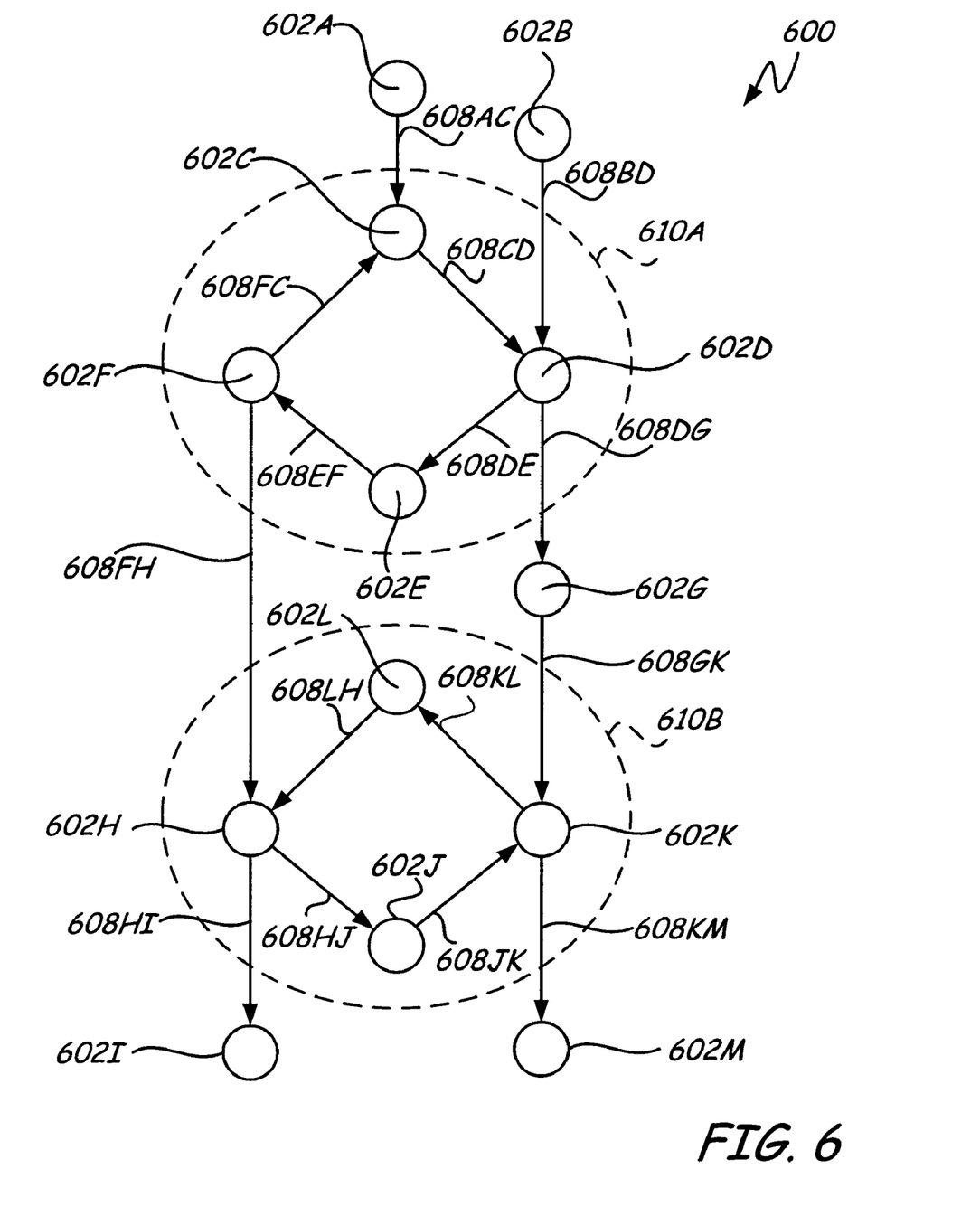
FIG. 6 is a simplified diagram of two cycled graphs according to an embodiment of the present invention.

A design can include several cycled parts, and the ramptimes of a cycled part can depend on the ramptimes of another cycled part, as shown in the oriented graph 600 of FIG. 6. Graph 600 includes cycled parts 610A and 610B, with a plurality of pins 602A–602M coupled by oriented edges 608. Pin 602C is part of cycled part 610A and has a ramptime that is dependent on all other pins 602D, 602E, and 602F within the cycled portion 610A.

Pin 602F in cycled part 610A is coupled to pin 602H in cycled part 610B by edge 608FH. Similarly, pin 602D in part 610A is coupled to pin 602K in part 610B through pin 602G and edges 608DG and 608GK.

In this example, given the orientation of the edges 608FH, 608DG and 608GK, the ramptime of pins 602H and 602K in cycled part 610B depend on ramptimes of cycled part 610A. Both cycled parts 610A and 610B are maximal cycled subgraphs. Because the ramptimes of the cycled part 610B depend on the ramptimes of the cycled part 610A, the ramptimes of the cycled part 610A have to be calculated earlier.

The maximal subgraph can be identified using the set M defined above so that the ramptime calculation algorithm can complete. The set M can be traced to locate all pins in a cycled subgraph part of the design. As mentioned above, there is an oriented edge $(A_1, A_0)$ such that $A_1 \in M$. The cycle localization algorithm back traces the pins in M, beginning with $A_1$ to identify all pins $A_1, A_2, \ldots, A_K \in M$ for any K such that there are edges $(A_1, A_0), (A_2, A_1), \ldots, (A_K, A_{K-1})$ of the oriented graph.

The set M is finite so that the algorithm eventually reaches a pin $A_N$ such that $A_N = A_n$ for some n<N, which defines a closed loop or cycle. There are two possibilities:

Case 1. There is an oriented edge $(b_0, a_j)$, such that $b_0 \in M$ and $n \leq j < N$. In other words, the ramptime of this identified cycle depends on a ramptime of an additional pin $b_0$, and the localization of the cycled subgraph should continue until a maximal subgraph is identified.

Case 2. There are no such edges $(b_0, a_j)$, so the required maximal subgraph is found. It contains the vertices $a_n, a_{n+1}, \ldots, a_{N-1}$.

In case 1, the algorithm back tracks again, beginning with pin $b_0$. This back track process identifies a sequence of pins $b_0, b_1, \ldots, b_k$ of the set M for each pin (0 to k) such that there are oriented edges $(b_1, b_0), (b_2, b_1), \ldots, (b_k, b_{k-1})$. Sooner or later, the algorithm identifies a pin $b_L$ that has been evaluated before.

Figure 7:
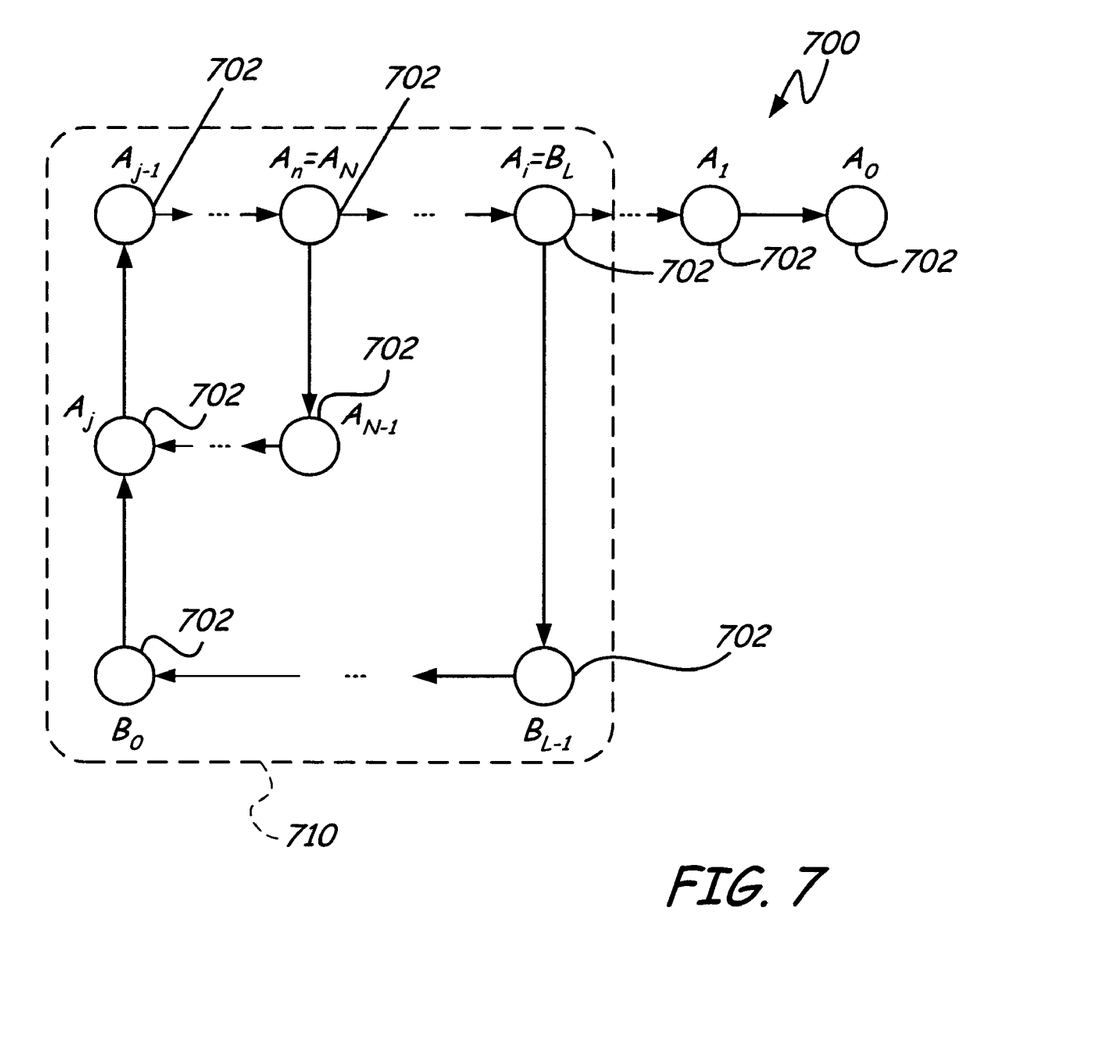
FIGS. 7, 8 and 9 illustrate a back tracing process of three cycled graphs according to embodiments of the present invention.
Figure 8:
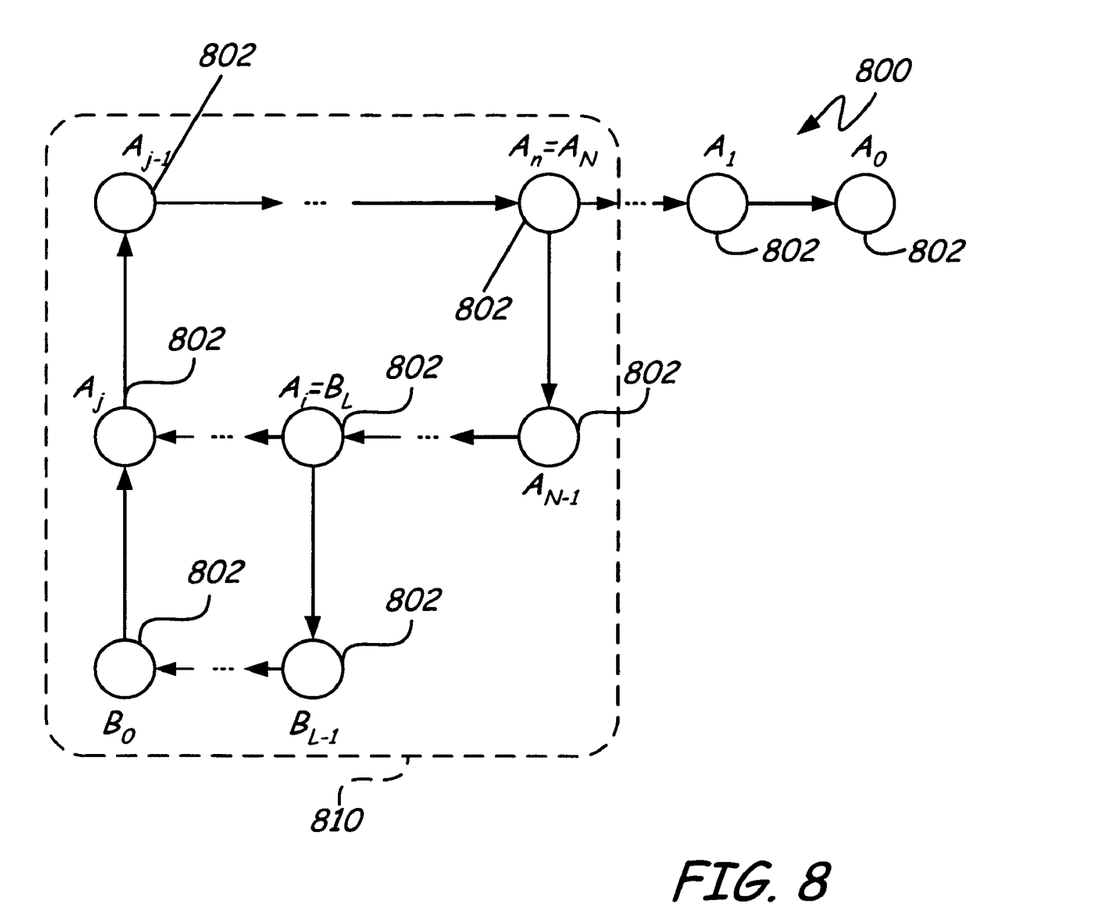
Figure 9:
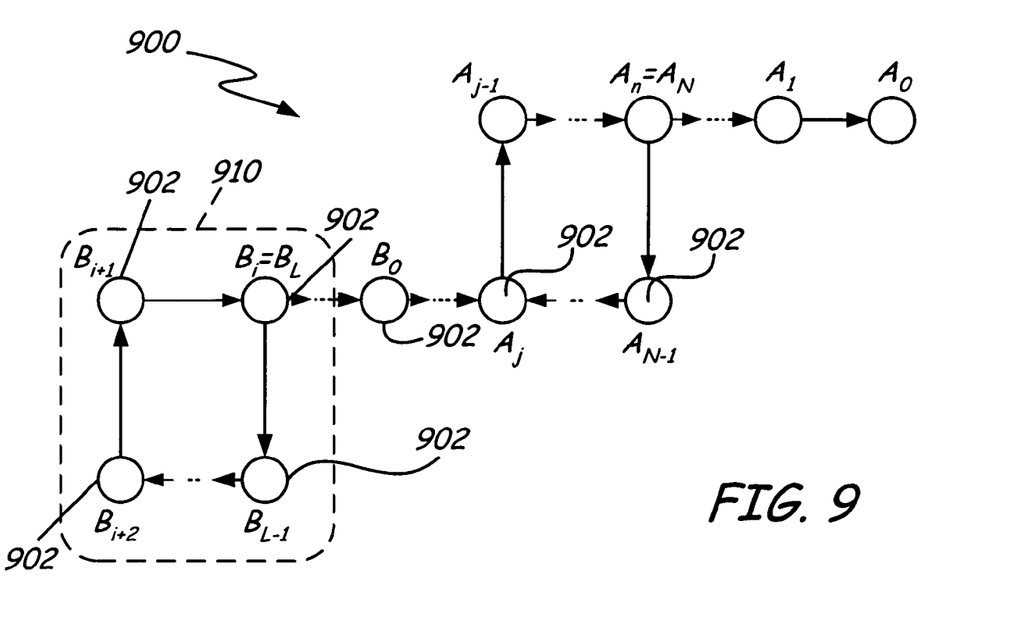

Three possibilities of the cycle localization process are shown in FIGS. 7–9. FIG. 7 shows a cycled graph 700 with a plurality of interconnected pins 702, and a cycled portion 710. In FIG. 7, the cycle localization algorithm begins with pin $A_0$ and back traces through cell pins $A_0, A_1, A_i, A_n, A_{j-1}, A_j, A_{N-1}$, to $A_N$, where $A_N = A_n$. Although a cycle has been found, the algorithm is in case 1, since there is an oriented edge $(B_0, A_j)$ such that $B_0 \in M$ and $n \leq j \leq N$.

The algorithm therefore back tracks again, beginning with $B_0$, until it locates pin $B_L$ that has been evaluated before. In this example, the cycled subgraph (bounded by dashed lines) has been extended and now contains cell pins $A_i, A_{i+1}, \ldots, A_{N-1}, B_0, B_1, \ldots, B_{L-1}$.

A second possibility is shown in FIG. 8. FIG. 8 illustrates a simplified oriented graph 800 according to an embodiment of the present invention. The graph 800 includes a plurality of pins 802, which are interconnected by oriented edges to form a cycled part 810. As discussed above, beginning with pin 802 ($A_0$), the algorithm back tracks through pins $A_i, A_n, A_{j-1}, A_1, A_{N-1}$, to $A_N$, where $A_N = A_n$. This is another example of case 1 in that pin $A_j$ has an oriented edge $(B_0, A_j)$ where $B_0 \in M$ (i.e. $B_0$ has an unknown ramptime calculation). The algorithm begins back tracking at cell pin $B_0$ until a cell pin $B_L$ is located that has already been evaluated $(B_L = A_i)$. This cycled subgraph shown by dashed line 810 has been extended and now contains pins $A_n, A_{n+1}, \ldots, A_{N-1}, B_0, B_1, \ldots, B_{L-1}$, where $B_L = A_i$ for some $n \leq i < N$.

Another possibility is shown in FIG. 9. FIG. 9 illustrates a simplified oriented graph 900 is shown with an identified cycled subgraph 910. The graph 900 includes a plurality of pins 902 interconnected by oriented edges in such a way as to produce a cycled subgraph 910.

In this example, the algorithm begins with pin $A_0$, and locates a first cycled subgraph including pins $A_n, A_{j-1}, A_j$, and $A_{n-1}$. Since the ramptime of $A_j$ depends on the ramptime of $B_0$, the algorithm continues with $B_0$ and locates a completely new cycled subgraph with pins $B_i, B_{i+1}, B_{i+2}$, and $B_{L-1}$, where $B_i = B_L$ for some I<L. This subgraph should be processed before the initial cycled subgraph. So, the algorithm should continue with the cycled subgraph 910.

From here, the level algorithm shown in FIG. 2 can be continued starting from the current cycled subgraph 710, 810, or 910, respectively.

Figure 10:
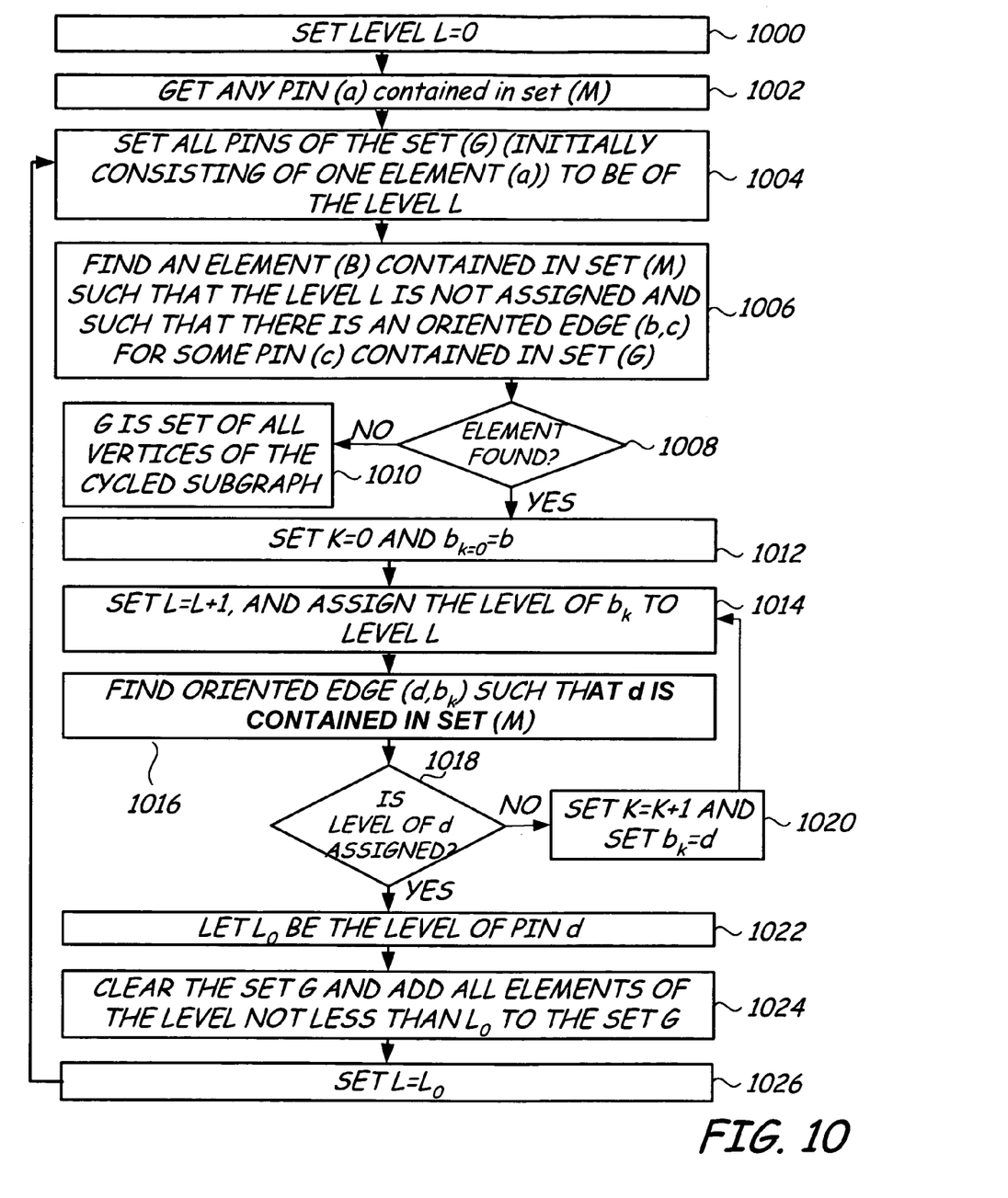
FIG. 10 is a simplified flow diagram of a process for assigning pins of a cell to a particular level.

FIG. 10 is a simplified flow diagram of the cycled subgraph localization algorithm according to an embodiment of the present invention. The system initializes the pin level (L) to zero (step 1000). The system takes any pin (A) contained in set (M) (step 1002), which is a set of pins (A) for which the ramptime calculation is not known after the level assignment algorithm is complete.

Considering a set G (initially consisting of one pin A), the algorithm sets all pins of the set (G) to be of level (L) (step 1004). The algorithm then finds a pin (B) contained within the set (M) such that the level (L) is not assigned and such that there is an oriented edge (B,A) for some pin A that is contained in the set (G) (step 1006). If no such pin is found (step 1008), then set G is the set of all vertices of the maximal subgraph (step 1010).

If the pin is found (step 1008), then index K is set to zero and $B_k$ is set to pin B (step 1012). The algorithm increments the level (L) and assigns $B_k$ to level (L) (step 1014). The algorithm then finds an oriented edge $(d,B_K)$, such that pin d is contained within set (M) (step 1016). This edge $(d,B_K)$ always exists. If the level of pin d is not already assigned (step 1018), then index K is incremented and $B_K$ is set equal to pin d (step 1020). Steps 1014–1018 are then repeated.

If the level of pin d is already assigned (step 1018), then level $L_0$ is set to the level of pin d (step 1022). The set G is cleared and all elements of levels equal to or greater than $L_0$ are added to the set G (step 1024). The level L is set to $L_0$ (step 1026), and steps 1004 and sequence are repeated until the maximal subgraph is identified.

Figure 11:
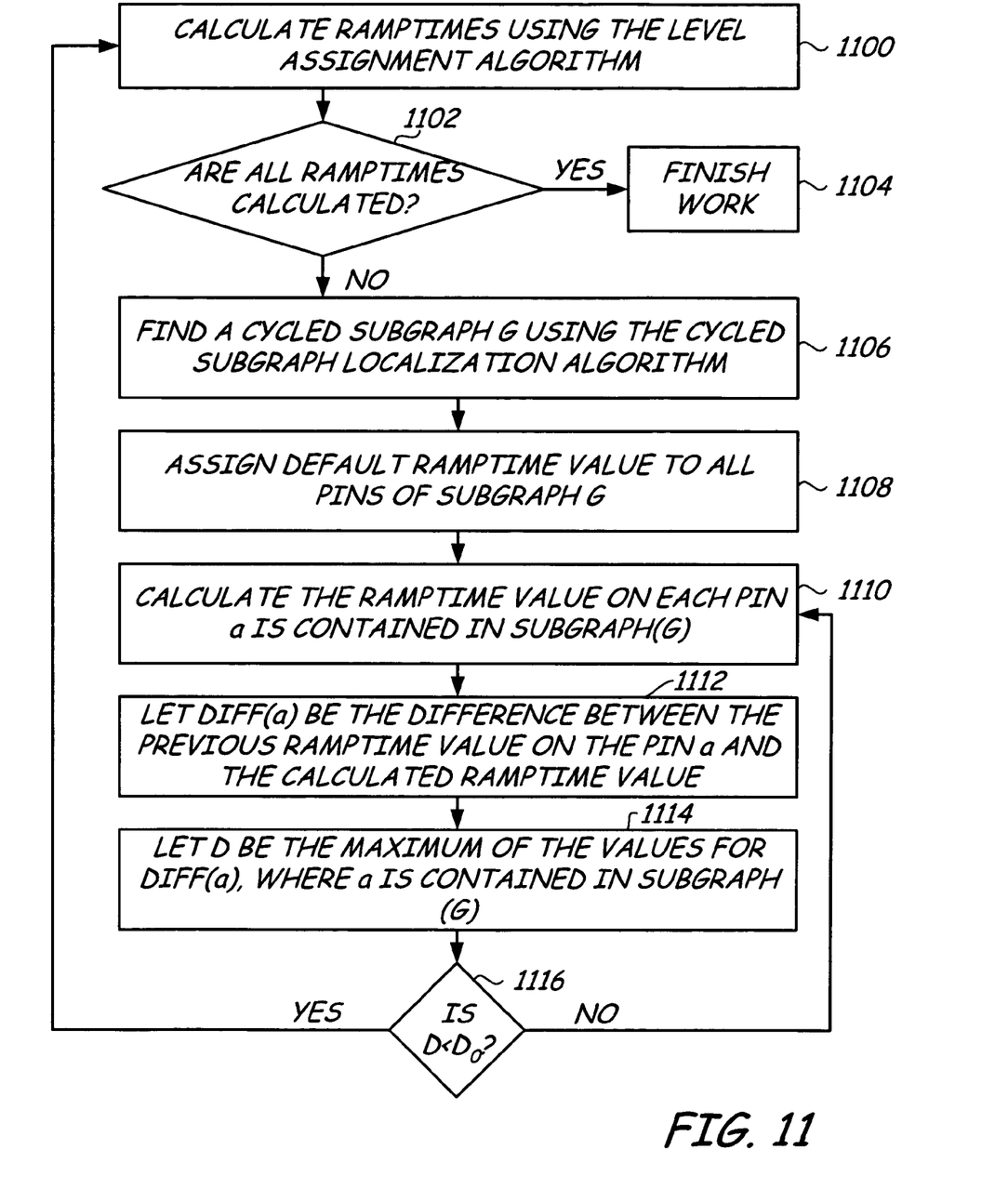
FIG. 11 is a simplified flow diagram of a process for localized ramptime calculation according to an embodiment of the present invention.

FIG. 11 is a simplified flow diagram of an algorithm for calculating ramptimes for pins of an integrated circuit layout pattern according to an embodiment of the present invention.

First, ramptimes for the non-cycled parts of the layout are calculated using the level assignment algorithm (shown in FIG. 2) (step 1100). The algorithm checks if all ramptimes for the layout have been calculated (step 1102). If all ramptimes are calculated (step 1102), then the work is finished (step 1104). Otherwise, the algorithm finds a cycled subgraph G using the cycled subgraph localization algorithm shown in FIG. 10 (step 1106). The system assigns a default ramptime value to all pins of the subgraph G (step 1108). The ramptime is calculated for each pin (aEG) of the subgraph G based on the assigned default ramptimes (step 1110). The system then calculates for each pin a difference between a previous ramptime value and the newly calculated ramptime value (step 1112). The system assigns to D a maximum difference value from the difference calculations of step 1112. If the maximum difference D is less than $D_0$ (a specified accuracy of the ramptime calculation for a particular design), then the system returns the calculated ramptime value to the level assignment algorithm and proceeds with step 1100. If the maximum difference D is greater than $D_0$, the system recalculates the ramptime value for each pin in the subgraph G (step 1110) using the newly calculated ramptimes for the pins, and repeats steps 1112 through 1116 until the ramptimes for all pins in the pin layout have been calculated.

Although the present invention has been described with reference to preferred embodiments, workers skilled in the art will recognize that changes may be made in form and detail without departing from the spirit and scope of the invention.

What is claimed is:

1. A method for calculating ramptime propagation for integrated circuit layout patterns having pins interconnected in an oriented graph in one or more closed loops, the method comprising:
   (a) calculating and outputting ramptime values for a first set of the pins, which are not connected to a closed loop while leaving a second set of the pins with unknown ramptime values;
   (b) identifying one or more closed loops by backtracking from the pins in the second set with unknown ramptime values; and
   (c) calculating iteratively a ramptime value and outputting the ramptime value for each pin in the one or more closed loops identified in (b).

2. The method of claim 1 wherein the step (a) of calculating ramptime values for the first set of pins comprises:
   (a1) assigning each pin to a pin level based on inputs to the pin from other pins having predetermined ramptimes, wherein the pin level is determined by a highest level of input to the pin; and
   (a2) calculating the ramptime value associated with each pin level by level.

3. The method of claim 2 wherein the step (a2) of calculating is performed in parallel with respect to all pins of a given level.

4. The method of claim 1 wherein the step (b) of backtracking comprises:
   (b1) selecting a starting pin as a starting point from the second set of pins for which a ramptime is unknown after step (a) is completed;
   (b2) identifying a next pin from the second set of pins for which an oriented edge exists between the starting pin and a next pin;
   (b3) setting the next pin as the starting pin; and
   (b4) constructing a cycled subgraph from the second set of pins by repeating the steps of identifying and setting.

5. The method of claim 4 wherein the steps (b2) and (b3) of identifying and setting are repeated until the cycled subgraph is maximal, wherein all pins of the subgraph have ramptimes that depend only on known ramptime values and on the ramptimes of other pins of the subgraph.

6. The method of claim 4 wherein if a pin of the constructed cycled subgraph depends on a ramptime of an additional pin in the second set of pins that is not contained in the cycled subgraph, the method further comprising:
   (b5) selecting the additional pin as the starting pin; and
   (b6) repeating the steps (b2) and (b3) of identifying and setting until the subgraph is maximal.

7. The method of claim 1 wherein the step of calculating iteratively, for each of the closed loops, comprises:
   (c1) assigning a ramptime value to each pin of the loop;
   (c2) calculating an updated ramptime value for each pin of the loop based on the assigned ramptime value of each other pin in the loop;
   (c3) assigning the calculated ramptime value to each pin of the loop; and
   (c4) repeating the steps of calculating and assigning the calculated ramptime value until a difference between the assigned ramptime value and the calculated ramptime value is less than a predetermined difference.

8. A method for calculating ramptime propagation on an integrated circuit layout, the method comprising:

(a) constructing an oriented graph of pins in the design;
(b) calculating and outputting ramptime values for a first set of pins in the layout using a pin level assignment algorithm, some of the pins of the first set of pins in the layout having predefined ramptimes;
(c) localizing a cycled portion of the layout, the cycled portion corresponding to a second set of pins of the layout that are interconnected to form a closed loop; and
(d) calculating iteratively ramptime values and outputting the ramptime value for each pin in the second set.

9. The method of claim 8 wherein the layout comprises a plurality of pins that are not included in the first set of pins which have unknown ramptimes after step (a); the second set of pins comprises pins selected from those pins having unknown ramptimes following step (a); and the method further comprises:
(e) calculating the ramptimes of at least one remaining pin having an unknown ramptime by using the ramptimes of the second set of pins calculated in step (c).

10. The method of claim 8 wherein the step (d) of calculating iteratively comprises:
(d1) assigning a default ramptime value to each pin in the second set;
(d2) calculating a ramptime value based on the default value for each pin in the second set; and
(d3) updating the default ramptime value with the calculated ramptime value.

11. The method of claim 10 further comprising: (d4) re-calculating the ramptime value based on the calculated ramptime value if a difference between the calculated ramptime value and the default ramptime value exceeds a predetermined limit, for each pin in the second set.

12. The method of claim 8 wherein the step (b) of calculating ramptime values using a level assignment algorithm comprises:
(b1) assigning a first level to each pin in the first set for which all input ramptime values are known or given;
(b2) assigning a subsequent level to each pin in the first set for which all inputs are received from a pin of a previous level, wherein the assigned subsequent level is equal to a highest level of pin corresponding to a received input plus one; and
(b3) calculating a ramptime value for all pins of a given level in parallel, once all pin levels are assigned.

13. The method of claim 8 wherein the step of localizing comprises:
(c1) selecting a pin from the plurality of pins for which the ramptime value is unknown;
(c2) constructing an oriented subgraph by backtracking from the selected pin until the closed loop is found.

14. The method of claim 13 and further comprising:
(c3) selecting a different pin if the ramptime of a pin in the closed loop depends on the ramptime of the different pin, and the ramptime of the different pin is unknown; and
(c4) repeating the step (a) of constructing an oriented subgraph with the different pin as the selected pin by backtracking until a further closed loop is found.

15. The method of claim 14 and further comprising the step of repeating the steps of selecting a different pin and repeating until the ramptime of each pin in the further closed loop is known or depends on other pins of the further closed loop.

* * * * *